(12) United States Patent
Hao (10) Patent No.: US 9,905,313 B2
(45) Date of Patent: Feb. 27, 2018

(54) GATE DRIVE CIRCUIT AND SHIFT REGISTER CIRCUIT

(71) Applicant: Shenzhen China Star Optoelectronics Technology Co., Ltd., Shenzhen, Guangdong (CN)

(72) Inventor: Sikun Hao, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 20 days.

(21) Appl. No.: 15/032,309

(22) PCT Filed: Dec. 31, 2015

(86) PCT No.: PCT/CN2015/100355
§ 371 (c)(1),
(2) Date: Apr. 26, 2016

(87) PCT Pub. No.: WO2017/080093
PCT Pub. Date: May 18, 2017

(65) Prior Publication Data
US 2017/0263330 A1    Sep. 14, 2017

(30) Foreign Application Priority Data

Nov. 12, 2015  (CN) .......................... 2015 1 0777679

(51) Int. Cl.
*H03K 19/20*    (2006.01)
*G11C 19/28*    (2006.01)
*H03K 17/687*   (2006.01)

(52) U.S. Cl.
CPC .......... *G11C 19/28* (2013.01); *H03K 17/6872* (2013.01); *H03K 19/20* (2013.01)

(58) Field of Classification Search
CPC ..... G11C 19/28; H03K 19/20; H03K 17/6872
See application file for complete search history.

(56) References Cited

U.S. PATENT DOCUMENTS

2017/0162152 A1\*   6/2017  Zhao .................... G09G 3/3677

\* cited by examiner

*Primary Examiner* — Jung Kim
(74) *Attorney, Agent, or Firm* — Andrew C. Cheng (57) ABSTRACT

The present disclosure provides a gate drive circuit including a plurality of cascaded shift register circuits, each shift register circuit include a signal transmission circuit and a nor gate latching circuit, wherein the signal transmission circuit includes a first signal transmission circuit and a second signal transmission circuit, the first signal transmission circuit transmits high part of a previous level transmission signal based on a first clock signal to the nor gate latching circuit, the second signal transmission circuit transmits low part of a previous level transmission signal based on the first clock signal to the nor gate latching circuit to perform latch, and a second clock signal triggers to output a current level gate drive pulse. In the above manner, the present disclosure is suitable for process of CMOS, low power consumption and noise margin width.

18 Claims, 3 Drawing Sheets

GATE DRIVE CIRCUIT AND SHIFT REGISTER CIRCUIT

FIELD OF THE DISCLOSURE

The present disclosure relates to a liquid crystal display technology field, and more particularly to a gate drive circuit and a shift register circuit.

BACKGROUND OF THE DISCLOSURE

A GOA (Gate Driver On Array) circuit uses an array process of conventional liquid crystal display process to formed a gate scan drive circuit on a substrate, in order to achieve the progressive scan drive. It has the advantage of reducing production costs and narrow border design for a variety of displays used. GOA circuit has to have two basic functions: the first one is to input a gate drive pulse and drive a gate line in the panel to open a TFT (Thin Film Transistor, thin-film transistor) in display area, charging pixels by the gate line; the second one is to provide a shift register circuit to, when the n level gate driver pulse output is completed, output the n+1 gate drive pulse by a clock control, and so passed on.

GOA circuit includes a pull-up circuit, a pull-up control circuit, a pull-down circuit, a Pull-down control circuit and a boost circuit for rising the electric potential. Specifically, the pull circuit is mainly responsible for outputting the input clock signal (Clock) to gate of the thin film transistor as a drive signal of liquid crystal display. The pull-up control circuit is responsible for controlling open of the pull-up circuit, usually effected by a signal transmitted from the previous level GOA circuit. The pull-down circuit is responsible for after output a scan signal, pulling down the scan signal to low potential rapidly, i.e. pulling down electric potential of gate of the thin film transistor to low potential; the pull-down control circuit is responsible for keeping the scan signal and signal of the pull-up circuit (commonly referred to the Q point) in a closed state (i.e. set negative potential), usually having two pull-down control circuit alternation affect alternatively. The boost circuit is responsible for second rising of electric potential of the Q point to ensure the normal output of G(N) of the pull-up circuit.

Different GOA circuit may use different processes. LTPS (Low Temperature Poly-silicon) process has the advantage of high electron mobility and maturity of the technology, now widely used small and medium size displays. CMOS (Complementary Metal Oxide Semiconductor, a complementary metal oxide semiconductor) LTPS process with low power consumption, electronic mobility, noise margin width, etc., so gradually the use of panel makers, and so need to develop the GOA circuit corresponding to the CMOS LTPS process.

SUMMARY OF THE DISCLOSURE

The present embodiment of the disclosure provides a gate drive circuit and a shift register circuit to be applied to CMOS process with low power consumption and noise margin width.

The present disclosure provides a gate drive circuit including a plurality of cascaded shift register circuits, each shift register circuit include a signal transmission circuit and a nor gate latching circuit, where the signal transmission circuit includes a first signal transmission circuit and a second signal transmission circuit, the first signal transmission circuit transmits high part of a previous level transmission signal based on a first clock signal to the nor gate latching circuit, the second signal transmission circuit transmits low part of a previous level transmission signal based on the first clock signal to the nor gate latching circuit to perform latch, and a second clock signal triggers to output a current level gate drive pulse.

Further, the signal transmission circuit and the nor gate latching circuit are respectively triggered along rising edge.

Further, the first signal transmission circuit includes a first NMOS transistor, a second NMOS transistor, a third NMOS transistor, a fourth NMOS transistor, a first PMOS transistor and a second PMOS transistor, a gate electrode of the first NMOS transistor connected with the previous level transmission signal, a gate electrode of the second NMOS transistor connected with the first clock signal, a source electrode of the second NMOS transistor connected with a drain electrode of the first NMOS transistor, a drain electrode of the second NMOS transistor connected with a source electrode of the first PMOS transistor, a gate electrode of the second PMOS transistor, a drain electrode of the third NMOS transistor, a gate electrode of the fourth NMOS transistor and the nor gate latching circuit, a gate electrode of the third NMOS transistor connected with a gate electrode of the first PMOS transistor, a drain electrode of the second PMOS transistor and a drain electrode of the fourth NMOS transistor, a source electrode of the first NMOS transistor, a source electrode of the third NMOS transistor and a source electrode of the fourth NMOS transistor connected with a first reference level, a source electrode of the first PMOS transistor and a source electrode of the second PMOS transistor connected with a second reference level.

Further, the second signal transmission circuit includes a fifth NMOS transistor, a sixth NMOS transistor, a seventh NMOS transistor and a third PMOS transistor, a gate electrode of the fifth NMOS transistor and a gate of the third PMOS transistor connected with the previous level transmission signal, a drain electrode of the fifth NMOS transistor connected with a drain electrode of the third PMOS transistor and a gate of the sixth NMOS transistor, a source electrode of the fifth NMOS transistor and a source electrode of the sixth NMOS transistor connected with the first reference level, a drain electrode of the third PMOS transistor connected with the second reference level, a drain electrode of the sixth NMOS transistor connected with a source electrode of the seventh NMOS transistor, a gate of the seventh NMOS transistor connected with the first clock signal, a drain electrode of the seventh NMOS transistor connected with the nor gate latching circuit.

Further, the nor gate latching circuit includes a nor gate circuit, the nor gate circuit includes an eighth NMOS transistor, a ninth NMOS transistor, a fourth PMOS transistor and a fifth PMOS transistor, a gate of the eighth NMOS transistor connected with a gate of the fourth PMOS transistor and the signal transmission circuit, the drain electrode of the eighth NMOS transistor connected with a source electrode of the ninth NMOS transistor, a drain electrode of the eighth NMOS transistor connected with a drain electrode of the fourth PMOS transistor and a drain electrode of the fifth PMOS transistor, a gate of the ninth NMOS transistor and a gate of the fifth PMOS transistor connected with the second clock signal, a source electrode of the fourth PMOS transistor and a source electrode of the fifth PMOS transistor connected with a first reference level.

Further, the nor gate latching circuit further includes a multi-stage inverter circuit connected with the nor gate latching circuit.

Further, the multi-stage inverter circuit includes a plurality of inverters arranged in series, the inverter includes a tenth NMOS transistor and a sixth PMOS transistor, a source electrode of the tenth NMOS transistor connected with a second reference level, a source electrode of the sixth PMOS transistor connected with the first reference level, a gate electrode of the tenth NMOS transistor connected with a gate electrode of the sixth PMOS transistor as an input of the inverter and connected with the nor gate latching circuit or the previous level inverter, a drain electrode of the tenth NMOS transistor connected with a drain electrode of the sixth PMOS transistor as an output of the inverter.

Further, the number of the inverters is three.

Further, the first clock signal offsets half of a clock cycle to obtain the second clock signal.

The present disclosure further includes a shift register circuit including a signal transmission circuit and a nor gate latching circuit, the signal transmission circuit includes a first signal transmission circuit and a second signal transmission circuit, the first signal transmission circuit transmits high part of a previous level transmission signal based on a first clock signal to the nor gate latching circuit, the second signal transmission circuit transmits low part of a previous level transmission signal based on the first clock signal to the nor gate latching circuit to perform latch, and a second clock signal triggers to output a current level gate drive pulse.

Further, the signal transmission circuit and the nor gate latching circuit are respectively triggered along rising edge.

Further, the first signal transmission circuit includes a first NMOS transistor, a second NMOS transistor, a third NMOS transistor, a fourth NMOS transistor, a first PMOS transistor and a second PMOS transistor, a gate electrode of the first NMOS transistor connected with the previous level transmission signal, a gate electrode of the second NMOS transistor connected with the first clock signal, a source electrode of the second NMOS transistor connected with a drain electrode of the first NMOS transistor, a drain electrode of the second NMOS transistor connected with a source electrode of the first PMOS transistor, a gate electrode of the second PMOS transistor, a drain electrode of the third NMOS transistor, a gate electrode of the fourth NMOS transistor and the nor gate latching circuit, a gate electrode of the third NMOS transistor connected with a gate electrode of the first PMOS transistor, a drain electrode of the second PMOS transistor and a drain electrode of the fourth NMOS transistor, a source electrode of the first NMOS transistor, a source electrode of the third NMOS transistor and a source electrode of the fourth NMOS transistor connected with a first reference level, a source electrode of the first PMOS transistor and a source electrode of the second PMOS transistor connected with a second reference level.

Further, the second signal transmission circuit includes a fifth NMOS transistor, a sixth NMOS transistor, a seventh NMOS transistor and a third PMOS transistor, a gate electrode of the fifth NMOS transistor and a gate of the third PMOS transistor connected with the previous level transmission signal, a drain electrode of the fifth NMOS transistor connected with a drain electrode of the third PMOS transistor and a gate of the sixth NMOS transistor, a source electrode of the fifth NMOS transistor and a source electrode of the sixth NMOS transistor connected with the first reference level, a drain electrode of the third PMOS transistor connected with the second reference level, a drain electrode of the sixth NMOS transistor connected with a source electrode of the seventh NMOS transistor, a gate of the seventh NMOS transistor connected with the first clock signal, a drain electrode of the seventh NMOS transistor connected with the nor gate latching circuit.

Further, the nor gate latching circuit includes a nor gate circuit, the nor gate circuit includes an eighth NMOS transistor, a ninth NMOS transistor, a fourth PMOS transistor and a fifth PMOS transistor, a gate of the eighth NMOS transistor connected with a gate of the fourth PMOS transistor and the signal transmission circuit, the drain electrode of the eighth NMOS transistor connected with a source electrode of the ninth NMOS transistor, a drain electrode of the eighth NMOS transistor connected with a drain electrode of the fourth PMOS transistor and a drain electrode of the fifth PMOS transistor, a gate of the ninth NMOS transistor and a gate of the fifth PMOS transistor connected with the second clock signal, a source electrode of the fourth PMOS transistor and a source electrode of the fifth PMOS transistor connected with a first reference level.

Further, the nor gate latching circuit further includes a multi-stage inverter circuit connected with the nor gate latching circuit.

Further, the multi-stage inverter circuit includes a plurality of inverters arranged in series, the inverter includes a tenth NMOS transistor and a sixth PMOS transistor, a source electrode of the tenth NMOS transistor connected with a second reference level, a source electrode of the sixth PMOS transistor connected with the first reference level, a gate electrode of the tenth NMOS transistor connected with a gate electrode of the sixth PMOS transistor as an input of the inverter and connected with the nor gate latching circuit or the previous level inverter, a drain electrode of the tenth NMOS transistor connected with a drain electrode of the sixth PMOS transistor as an output of the inverter.

Further, the number of the inverters is three.

Further, the first clock signal offsets half of a clock cycle to obtain the second clock signal.

By the above scheme, the beneficial effects of the present disclosure is that: a gate drive circuit of the present disclosure includes a plurality of cascaded shift register circuits, each shift register circuit include a signal transmission circuit and a nor gate latching circuit, where the signal transmission circuit includes a first signal transmission circuit and a second signal transmission circuit, the first signal transmission circuit transmits high part of a previous level transmission signal based on a first clock signal to the nor gate latching circuit, the second signal transmission circuit transmits low part of a previous level transmission signal based on the first clock signal to the nor gate latching circuit to perform latch, and a second clock signal triggers to output a current level gate drive pulse. In order to be applied to CMOS process with low power consumption and noise margin width.

BRIEF DESCRIPTION OF THE DRAWINGS

In order to more clearly illustrate example embodiment of the present disclosure, the technical solution, embodiments will be described in the following figures for example need to use brief Apparently, the drawings in the following description are only some of the disclosure embodiments, those of ordinary skill in speaking, in the premise without creative efforts can also obtain other drawings according to these drawings. Wherein.

DETAILED DESCRIPTION OF PREFERRED EMBODIMENTS

Hereinafter, the present disclosure in conjunction with the accompanying drawings which illustrate, were clearly the technical solution of the embodiment of the present disclosure, fully described, obviously, the described embodiments are merely part of embodiments of the present disclosure, but not all embodiments cases. Based on the embodiments of the present disclosure, all other embodiments to those of ordinary skill in the premise of no creative efforts obtained, are within the scope of protection of the present disclosure.

Figure 1:
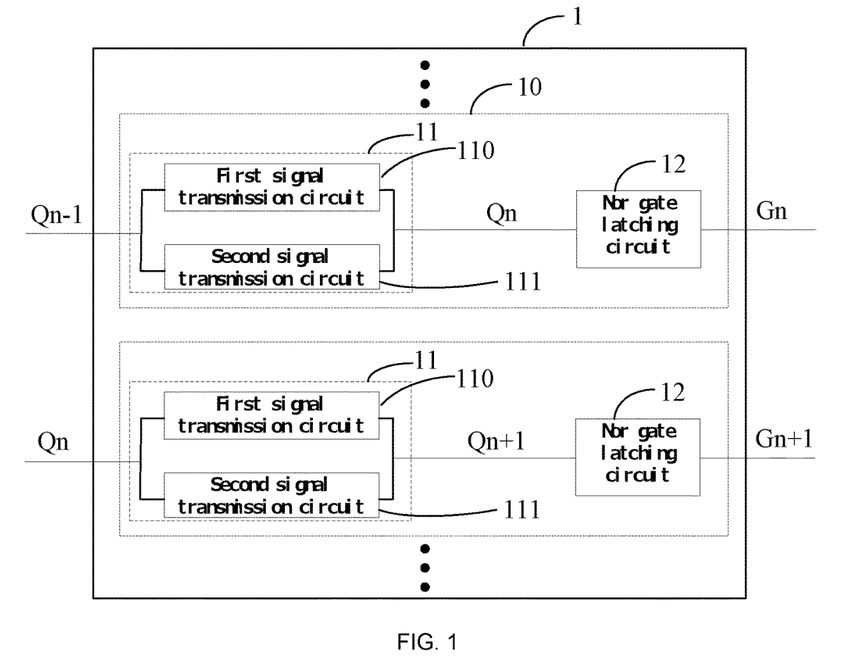
FIG. 1 is a schematic structural view of a drive circuit of the present disclosure embodiment.

Refer to FIG. 1, FIG. 1 is a schematic structural view of a drive circuit of the present disclosure embodiment. As shown in FIG. 1, a gate drive circuit 1 includes a plurality of cascaded shift register circuits 10, each shift register circuit 10 includes a signal transmission circuit 11 and a nor gate latching circuit 12, further, the signal transmission circuit 11 includes a first signal transmission circuit 110 and a second signal transmission circuit 111, and the first signal transmission circuit 110 transmits the high part of a previous level transmission signal Qn−1 based on a first clock signal to the nor gate latching circuit 12, and the second signal transmission circuit 111 transmits the low part of a previous level transmission signal Qn−1 based on the first clock signal to the nor gate latching circuit 12 to perform latch, and the second clock signal CK2 triggers to output a current level gate drive pulse Gn. The signal transmission circuit 11 and the nor gate latching circuit 12 are respectively triggered along rising edge. The previous level transmission signal Qn−1 outputs a current level transmission signal Qn after passing through the signal transmission circuit 11 and outputs the current level gate drive pulse Gn after passing through the nor gate latching circuit 12. When the current level transmission signal Qn in a next level shift register circuit 10 transmitted by the signal transmission circuit 11 outputs a next level transmission signal Qn+1, a next level gate drive pulse Gn+1 is output by passing through the nor gate latching circuit 12 in the next level shift register circuit 10, and all the levels of gate drive pulse can output by this continuous transmission. The embodiments of the present disclosure controls the high and low level signal through the signal transmission circuit 11, latching signals by passing through the nor gate latching circuit 12. The present disclosure can be applied to CMOS process with low power consumption and noise margin width.

Figure 2:
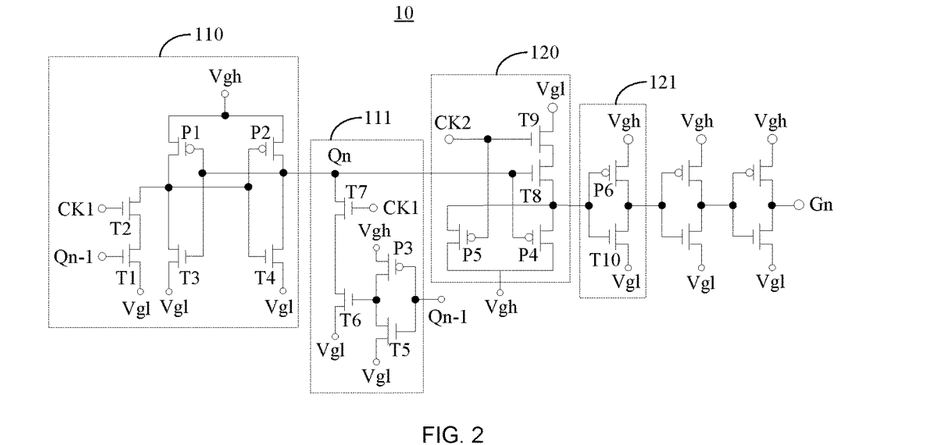
FIG. 2 is a circuit diagram of the n level shift register circuit in FIG. 1.

In a more specific embodiment, shown in FIG. 2, in a n level shift register, for example, n is a whole number, a first signal transmission circuit 110 includes a first NMOS transistor T1, a second NMOS transistor T2, a third NMOS transistor T3, a fourth NMOS transistor T4, a first PMOS transistor P1 and a second transistor P2. The gate of the first NMOS transistor T1 connected with the previous level transmission signal Qn−1, and gate of the second NMOS transistor T2 connected with the first clock signal CK1, a source electrode of the second NMOS transistor T2 is connected with drain electrode of the first NMOS transistor T1, a drain electrode of the second NMOS transistor T2 is connected with the source electrode of the first PMOS transistor P1, the gate of the second PMOS transistor P2, the drain electrode of the NMOS transistor T3, the gate of the fourth NMOS transistor T4 and the nor gate latching circuit 12, the gate of the third NMOS transistor T3 is connected with the gate of the first PMOS transistor P1, the drain electrode of the second PMOS transistor P2 is connected with the drain of the fourth NMOS transistor T4, the source electrode of the first NMOS transistor T1, the source electrode of the third NMOS transistor T3 and the source electrode of the fourth NMOS transistor T4 connected with a first reference level Vgl, the source electrode of the first PMOS transistor P1 and the source electrode of the second PMOS transistor P2 connected with a second reference level Vgh. Where the value of the first reference level Vgl is less than value of the second reference level Vgh.

The second signal transmission circuit 111 includes a fifth NMOS transistor T5, a sixth NMOS transistor T6, a seventh NMOS transistor T7 and a third PMOS transistor P3, the gate of the fifth NMOS transistor T5 and the gate of the third PMOS transistor P3 are connected with a previous level transmission signal Qn−1, and the drain electrode of the fifth NMOS transistor T5 is connected with the drain electrode of the third PMOS transistor P3 and the gate of the sixth NMOS transistor T6, and the source electrode of the fifth NMOS transistor T5 and the source electrode of the sixth NMOS transistor T6 are connected with the first reference level Vgl, and the drain of the third PMOS transistor P3 is connected with the second reference level Vgh, and the drain electrode of the sixth NMOS transistor T6 is connected with the source electrode of the seventh NMOS transistor T7, and the gate of the seventh NMOS T7 transistor is connected with the first clock signal CK1, the drain electrode of the seventh NMOS transistor T7 is connected with the nor gate latching circuit 12.

Specific work of the signal transmission circuit 11 as follows:

When the first clock signal is rising edge and the previous level transmission signal Qn−1 is low potential, the first NMOS transistor T1 is turned off and the first signal transmission circuit 110 is not working, i.e. the previous level transmission signal Qn−1 cannot transmitted to the nor gate latching circuit 12 by passing through the first signal transmission circuit 110. The fifth NMOS transistor T5 is turned off and the third PMOS transistor P3 is turned on to make sixth NMOS transistor T6 be turned on. At the same time the seventh NMOS transistor T7 is turned on and the previous level transmission signal Qn outputted by the second transmission circuit 111 is low potential.

When the first clock signal is rising edge and the previous level transmission Qn−1 is high potential, the fifth NMOS transistor T5 is turned and the third PMOS transistor P3 turned off to make the sixth NMOS transistor T6 being turned off. The second signal transmission circuit 111 is not working; namely, the previous level transmission signal Qn−1 cannot be transmitted to the nor gate latching circuit 12 by passing through the second signal transmission circuit 111. When the first NMOS transistor T1 is turned on, the second NMOS transistor T2 is turned on, the second PMOS transistor P2 is turned on and the current level transmission signal Qn outputted by the first signal transmission circuit 110 is high potential, the third NMOS transistor T3 is turned on, the first PMOS transistor P1 and the fourth NMOS transistor T4 is turned off.

Thus, the first signal transmission circuit 110 on rising edge of the first clock signal CK1 transmits high potential of the previous level transmission signal Qn−1 to the nor gate latching circuit 12. The second signal transmission 111 on rising edge of the first clock signal CK1 transmits low potential of the previous level transmission signal Qn−1 to the nor gate latching circuit 12. The high potential of the previous level transmission signal Qn−1 and the low potential of the previous level transmission signal Qn−1 are combined to output the current level transmission signal Qn completely to the nor gate latching circuit 12.

Preferably, the nor gate latching circuit 12 includes a nor gate circuit 120, the nor gate circuit 120 includes an eighth NMOS transistor T8, a ninth NMOS transistor T9, a fourth PMOS transistor P4 and a fifth PMOS transistor P5, the gate of the eighth NMOS transistor T8 is connected with the gate of the fourth PMOS transistor P4 and the signal transmission circuit 11, the drain electrode of the eighth NMOS transistor T8 is connected with the source electrode of the ninth NMOS transistor T9, the drain electrode of the eighth NMOS transistor T8 is connected with the drain electrode of the fourth PMOS transistor P4 and the drain electrode of the fifth PMOS transistor P5, the gate of the ninth NMOS transistor T9 and the gate of the fifth PMOS transistor P5 are connected with the second clock signal CK2, the source electrode of the fourth PMOS transistor P4 and the source electrode of the fifth PMOS transistor P5 are connected with the first reference level Vgl.

Preferably, the nor gate latching circuit 12 further includes a multi-stage inverter circuit connected with the nor gate latching circuit 120. The multi-stage inverter circuit includes a plurality of inverters 121 arranged in series, and the inverter 121 includes a tenth NMOS transistor T10 and a sixth PMOS transistor P6, the source electrode of the tenth NMOS transistor T10 is connected with the second reference level Vgh, the source electrode of the sixth PMOS transistor P6 is connected with the first reference level Vgl, the gate of the tenth NMOS transistor T10 is connected with gate of the sixth PMOS transistor P6 as a input of the inverter 121 and connected with the nor gate latching circuit 120 or the previous level inverter 121, the drain electrode of the tenth NMOS transistor T10 is connected with the drain electrode of the sixth PMOS transistor P6 as a output of the inverter 121 and connected with the next level inverter 121 or be a final output. In the present disclosure embodiment, the number of the inverters is three. The first clock signal CK1 offsets half of a clock cycle to obtain the second clock signal CK2.

Specific work of the nor gate latching circuit 12 as follows: in conjunction FIG. 1 and FIG. 2 shows, only when the rising edge of the second clock signal CK2 and the current level transmission signal Qn outputted by the signal transmission circuit 11 is high potential, and the nor gate latching circuit 120 output low potential and outputted high potential after passing through the three level inverters 121, and this time the outputted current level gate drive pulse Gn is high potential.

Figure 3:
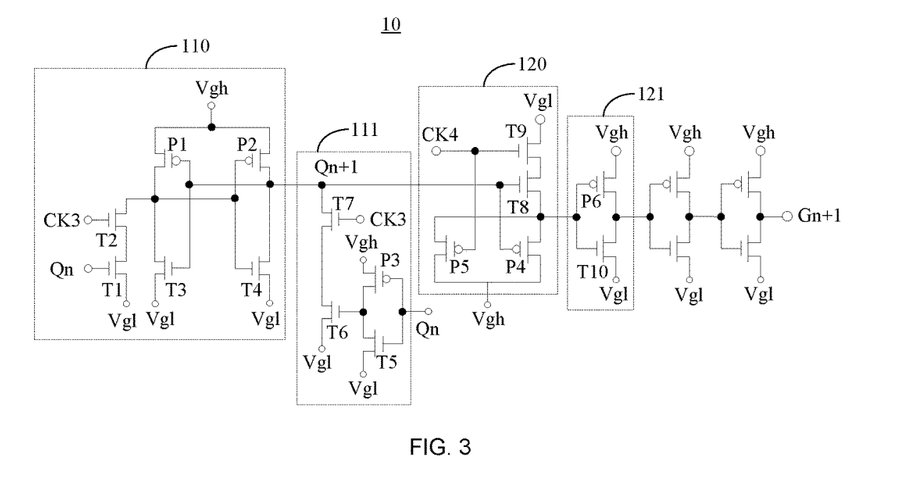
FIG. 3 is a circuit diagram of the n+1 level shift register circuit in FIG. 1.

As shown in FIG. 3, in the n+1 level shift register circuit 10, the first clock signal is CK3, and the second clock signal is CK4. The gate of the first NMOS transistor T1, the gate of the third PMOS transistor P3 and the gate of the fifth NMOS transistor T5 are input the current level transmission signal Qn. The current level transmission signal Qn is formed by the n level shift register circuit 10. When the CK3 is rising edge and the current level (i.e. the n level) transmission signal Qn is high potential, the first signal transmission circuit 110 outputs high potential of the n+1 level transmission signal Qn+1. When the CK3 is rising edge and the n level transmission signal Qn is low potential, the second signal transmission circuit 110 outputs low potential of the n+1 level transmission signal Qn+1. The first signal transmission circuit 110 and the second signal transmission circuit 111 are combined to output the n+1 level transmission signal Qn+1 completely. The n+1 level gate drive pulse Gn+1 is outputted by the nor gate latching circuit composed of the nor gate latching circuit 120 and a plurality of inverters 121 arranged in series.

Figure 4:
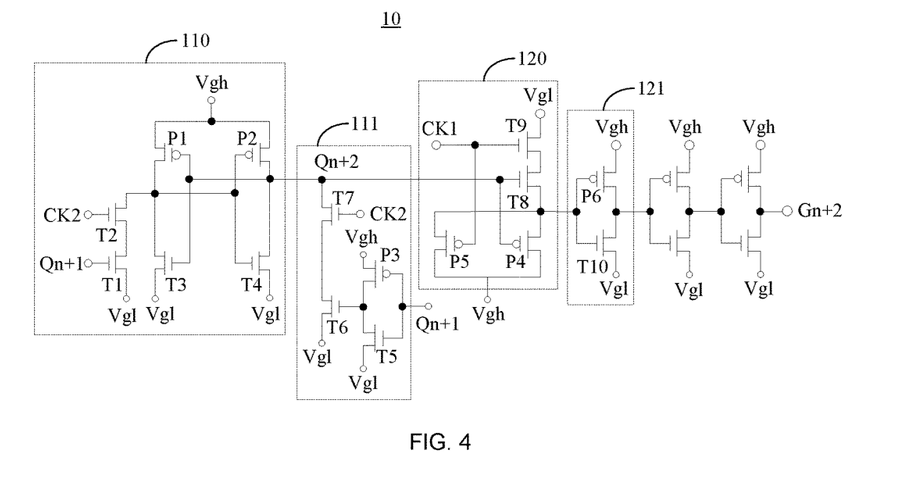
FIG. 4 is a circuit diagram of the n+2 level shift register circuit in FIG. 1.

As shown in FIG. 4, in the n+2 level shift register circuit 10, the first clock signal is CK2, the second clock signal is CK1. The gate of the first NMOS transistor T1, the gate of the third PMOS transistor P3 and the gate of the fifth NMOS transistor T5 input the n+1 level transmission signal Qn+1. The n+1 level transmission signal Qn+1 is formed by the n+1 level shift register circuit 10. When the CK2 is rising edge and the n+1 level transmission signal Qn+1 is high potential, the first signal transmission circuit 110 outputs high potential of the n+2 level transmission signal Qn+2. When the CK2 is rising edge and the n+1 level transmission signal Qn+1 is low potential, the second signal transmission circuit 111 outputs low potential of the n+2 level transmission signal Qn+2. The high potential of the n+2 level transmission signal Qn+2 and the low potential of the n+2 level transmission signal Qn+2 are combined to output the n+2 level transmission signal Qn+2 completely. The n+2 level gate drive pulse Gn+2 is outputted by the nor gate latching circuit composed of the nor gate latching circuit 120 and a plurality of inverters 121 arranged in series.

Figure 5:
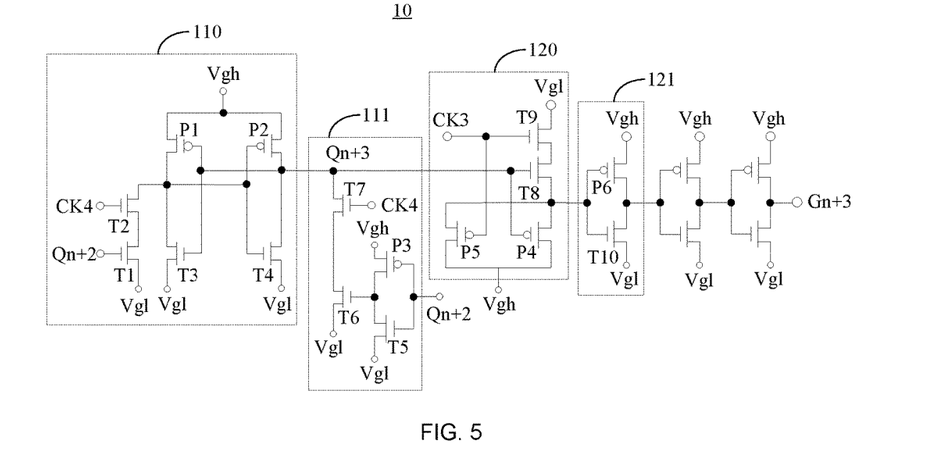
FIG. 5 is a circuit diagram of the n+3 level shift register circuit in FIG. 1.

As shown in FIG. 5, in the n+3 level shift register circuit 10, the first clock signal is CK4, and the second clock signal is CK3. The gate of the first NMOS transistor T1, the gate of the third PMOS transistor P3 and the gate of the fifth NMOS transistor T5 are input the n+2 level transmission signal Qn+2. The n+2 level transmission signal Qn+2 is formed by the n+2 level shift register circuit 10. When the CK4 is rising edge and the n+2 level transmission signal Qn+2 is high potential, the first signal transmission circuit 110 outputs high potential of the n+3 level transmission signal Qn+3. When the CK4 is rising edge and the n+2 level transmission signal Qn+2 is low potential, the second signal transmission circuit 111 outputs low potential of the n+3 level transmission signal Qn+3. The high potential of the n+3 level transmission signal Qn+3 and the low potential of the n+3 level transmission signal Qn+3 are combined to output the n+3 level transmission signal Qn+3 completely. And outputted the n+3 level gate drive pulse Gn+3 by the nor gate latching circuit composed of the nor gate latching circuit 120 and a plurality of inverters 121 arranged in series.

In the above FIGS. 2 to 5, the first clock signal CK1 offsets quarter of a clock cycle to obtain a third clock signal CK3, and the third clock signal CK3 offsets quarter of a clock cycle to obtain the second clock signal CK2, and the second CK2 offsets quarter of a clock cycle to obtain a fourth clock signal CK4, i.e. the clock signal CK4 and the clock signal 3 have a difference of one-half clock cycle. And the clock signal CK2 and the clock signal CK1 also have a difference of one-half clock cycle.

Cascading the shift register circuit 10 in the above FIGS. 2 to 5 sequentially, and turn the cycle to obtain the gate drive circuit 1 of the present disclosure embodiment.

Figure 6:
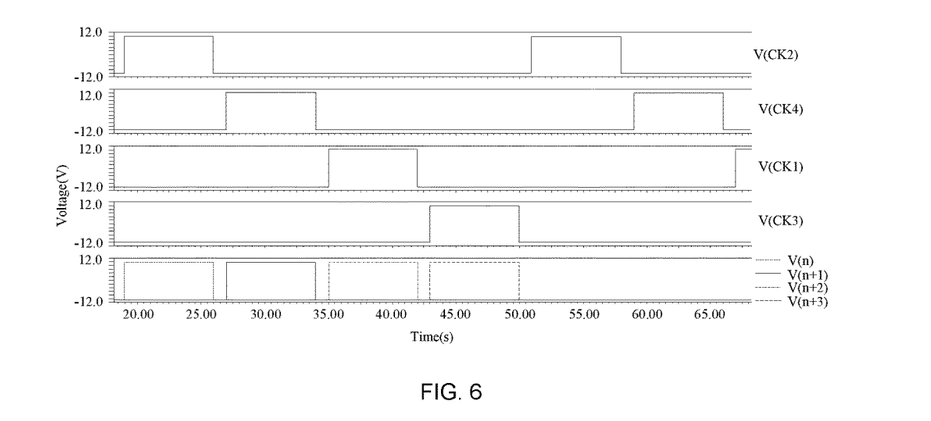
FIG. 6 is a timing diagram simulation of a gate drive circuit of the present disclosure embodiment.

FIG. 6 is a timing diagram simulation of a gate drive circuit of the present disclosure embodiment. Y-axis is Voltage, and X-axis is Time. The FIG. 6 simulating the CK1, CK2, CK3 and CK4 of the n level shift register circuit 10 to the n+3 level shift register circuit 10 and a timing diagram of the gate drive pulse Gn, Gn+1, Gn+2 and Gn+3. The timing diagram is corresponds to the gate drive circuit in FIGS. 2 to 5. As can be seen from the figure, sequentially from left to right to output the n level gate drive pulse Gn in gate drive circuit, the n+1 level gate drive pulse Gn+1, the n+2 level gate drive pulse Gn+2 and the n+3 level gate drive pulse Gn+3. It can clearly be seen, the timing simulation of the gate drive circuit is same as the expected timing theory and suitable for process of CMOS with low power consumption and noise margin width.

The present disclosure further provides a shift register circuit, the shift register circuit 10 includes a signal transmission circuit 11 and a nor gate latching circuit 12. Refer to FIG. 2, the signal transmission circuit 11 includes a first signal transmission circuit 110 and a second signal transmission circuit 111. The first signal transmission circuit 110 transmits the high part of the previous level transmission signal Qn−1 based on a first clock signal CK1 to the nor gate latching circuit 12. The second signal transmission circuit 111 transmits the low part of the previous level transmission signal Qn−1 based on the first clock signal CK1 to the nor gate latching circuit 12 to perform latch, and triggered by a second clock signal CK2 to output a current level gate drive pulse Gn.

The first signal transmission circuit 110 includes a first NMOS transistor T1, a second NMOS transistor T2, a third NMOS transistor T3, a fourth NMOS transistor T4, a first PMOS transistor P1 and a second PMOS transistor P2, the gate of the first NMOS transistor T1 is connected with the previous level transmission signal Qn−1, and the gate of the second NMOS transistor T2 is connected with the first clock signal CK1, and the source electrode of the second NMOS transistor T2 is connected with the drain electrode of the first NMOS transistor T1, and the drain electrode of the second NMOS transistor T2 is connected with the source electrode of the first PMOS transistor P1, the gate of the second PMOS transistor P2, the drain electrode of the NMOS transistor T3, the gate of the fourth NMOS transistor T4 and the nor gate latching circuit 12, and the gate of the third NMOS transistor T3 is connected with the gate of the first PMOS transistor P1, the drain electrode of the second PMOS transistor P2 and the drain electrode of the fourth NMOS transistor T4, and the source electrode of the first NMOS transistor T1, the source electrode of the third NMOS transistor T3 and the source electrode of the fourth NMOS transistor T4 are connected with a first reference level Vgl, and the source electrode of the first PMOS transistor P1 and the source electrode of the second PMOS transistor P2 are connected with a second reference level Vgh. Value of the first reference level Vgl is less than value of the second reference level Vgh.

The second signal transmission circuit 111 includes a fifth NMOS transistor T5, a sixth NMOS transistor T6, a seventh NMOS transistor T7 and a third PMOS transistor P3, the gate of the fifth NMOS transistor T5 and the gate of the third PMOS transistor P3 are connected with the previous level transmission signal Qn−1, and the drain electrode of the fifth NMOS transistor T5 is connected with the drain electrode of the third PMOS transistor P3 and the gate of the sixth NMOS transistor T6, and the source electrode of the fifth NMOS transistor T5 and the source electrode of the sixth NMOS transistor T6 are connected with the first reference level Vgl, and the drain of the third PMOS transistor P3 is connected with the second reference level Vgh, and the drain electrode of the sixth NMOS transistor T6 is connected with the source electrode of the seventh NMOS transistor T7, and the gate of the seventh NMOS T7 transistor is connected with the first clock signal CK1, and the drain electrode of the seventh NMOS transistor T7 is connected with the nor gate latching circuit 12.

Specific work of the signal transmission circuit 11 as follows:

When the first clock signal is rising edge and previous level transmission signal Qn−1 is low potential, the first NMOS transistor T1 is turned off and the first signal transmission circuit 110 is not working, i.e. the previous level transmission signal Qn−1 cannot transmitted to the nor gate latching circuit 12 by passing through the first signal transmission circuit 110. The fifth NMOS transistor T5 is turned off and the third PMOS transistor P3 is turned on to make sixth NMOS transistor T6 be turned on, the seventh NMOS transistor T7 is turned on and the previous level transmission signal Qn outputted by the second transmission circuit 111 is low potential.

When the first clock signal is rising edge and the previous level transmission Qn−1 is high potential, the fifth NMOS transistor T5 is turned and the third PMOS transistor P3 turned off to make the sixth NMOS transistor T6 be turned off and the second signal transmission circuit 111 is not working, i.e. the previous level transmission signal Qn−1 cannot transmitted to the nor gate latching circuit 12 by passing through the second signal transmission circuit 111. When the first NMOS transistor T1 is turned on, the second NMOS transistor T2 is turned on, the second PMOS transistor P2 is turned on and the current level transmission signal Qn outputted by the first signal transmission circuit 110 is high potential, the third NMOS transistor T3 is turned on, the first PMOS transistor P1 and the fourth NMOS transistor T4 is turned off.

Thus, the first signal transmission circuit 110 on rising edge of the first clock signal CK1 transmits the high potential of the previous level transmission signal Qn−1 to the nor gate latching circuit 12. The second signal transmission 111 on rising edge of the first clock signal CK1 transmits the low potential of the previous level transmission signal Qn−1 to the nor gate latching circuit 12. The high potential of the previous level transmission signal Qn−1 and the low potential of the previous level transmission signal Qn−1 are combined to output the current level transmission signal Qn completely to the nor gate latching circuit 12.

Preferably, the nor gate latching circuit 12 includes a nor gate circuit 120, the nor gate circuit 120 includes an eighth NMOS transistor T8, a ninth NMOS transistor T9, a fourth PMOS transistor P4 and a fifth PMOS transistor P5, and the gate of the eighth NMOS transistor T8 is connected with the gate of the fourth PMOS transistor P4 and the signal transmission circuit 11, and the drain electrode of the eighth NMOS transistor P8 is connected with the source electrode of the ninth NMOS transistor T9, and the drain electrode of the eighth NMOS transistor P8 is connected with the drain electrode of the fourth PMOS transistor P4 and the drain electrode of the fifth PMOS transistor P5, and the gate of the ninth NMOS transistor T9 and the gate of the fifth PMOS transistor P5 are connected with the second clock signal CK2, the source electrode of the fourth PMOS transistor P4 and the source electrode of the fifth PMOS transistor P5 are connected with the first reference level Vgl.

Preferably, the nor gate latching circuit 12 further includes a multi-stage inverter circuit connected with the nor gate latching circuit 120. The multi-stage inverter circuit includes a plurality of inverters 121 arranged in series, the inverter 121 includes a tenth NMOS transistor T10 and a sixth PMOS transistor P6, and the source electrode of the tenth NMOS transistor T10 is connected with the second reference level Vgh, and the source electrode of the sixth PMOS transistor P6 is connected with the first reference level Vgl, and the gate of the tenth NMOS transistor T10 is connected with the gate of the sixth PMOS transistor P6 as a input of the inverter 121 and connected with the nor gate latching circuit 120 or the previous level inverter 121, the drain electrode of the tenth NMOS transistor T10 is connected with the drain electrode of the sixth PMOS transistor P6 as a output of the inverter 121 and connected with the next level inverter 121 or be a final output. In the present disclosure embodiment, the number of the inverters is three. The first clock signal CK1 offsets half of a clock cycle to obtain the second clock signal CK2.

Specific work of the nor gate latching circuit 12 as follows: in conjunction FIG. 1 and FIG. 2 shows, only when the rising edge of the second clock signal CK2 and the current level transmission signal Qn outputted by the signal transmission circuit 11 is high potential, the nor gate latching circuit 120 output low potential and outputted high potential after passing through the three level inverters 121, this time the outputted current level gate drive pulse Gn is high potential.

In summary, the gate drive circuit 1 of the present disclosure includes a plurality of cascaded shift register circuits 10, each shift register circuit 10 include a signal transmission circuit 11 and a nor gate latching circuit 12, and the signal transmission circuit 11 includes a first signal transmission circuit 110 and a second signal transmission circuit 111, the first signal transmission circuit 110 transmits the high part of the previous level transmission signal based on a first clock signal to the nor gate latching circuit 12, the second signal transmission circuit 111 transmits the low part of the previous level transmission based on the first clock signal to the nor gate latching circuit 12 to perform latch, and triggered by a second clock signal to output a current level gate drive pulse and suitable for process of CMOS with low power consumption and noise margin width.

The above are only embodiments of the present disclosure is not patented and therefore limit the scope of the present disclosure, any use of the contents of the present specification and drawings made equivalent or equivalent structural transformation process, either directly or indirectly, use the other relevant technical fields are included in the patent empathy scope of the disclosure.

What is claimed is:

1. A gate drive circuit, wherein the gate drive circuit comprises a plurality of cascaded shift register circuits, each shift register circuit comprises a signal transmission circuit and a nor gate latching circuit, wherein the signal transmission circuit comprises a first signal transmission circuit and a second signal transmission circuit, the first signal transmission circuit transmits high part of a previous level transmission signal based on a first clock signal to the nor gate latching circuit, the second signal transmission circuit transmits low part of a previous level transmission signal based on the first clock signal to the nor gate latching circuit to perform latch, and a second clock signal triggers to output a current level gate drive pulse.

2. The gate drive circuit according to claim 1, wherein the signal transmission circuit and the nor gate latching circuit are respectively triggered along rising edge.

3. The gate drive circuit according to claim 1, wherein the first signal transmission circuit comprises a first NMOS transistor, a second NMOS transistor, a third NMOS transistor, a fourth NMOS transistor, a first PMOS transistor and a second PMOS transistor, a gate electrode of the first NMOS transistor connected with the previous level transmission signal, a gate electrode of the second NMOS transistor connected with the first clock signal, a source electrode of the second NMOS transistor connected with a drain electrode of the first NMOS transistor, a drain electrode of the second NMOS transistor connected with a source electrode of the first PMOS transistor, a gate electrode of the second PMOS transistor, a drain electrode of the third NMOS transistor, a gate electrode of the fourth NMOS transistor and the nor gate latching circuit, a gate electrode of the third NMOS transistor connected with a gate electrode of the first PMOS transistor, a drain electrode of the second PMOS transistor and a drain electrode of the fourth NMOS transistor, a source electrode of the first NMOS transistor, a source electrode of the third NMOS transistor and a source electrode of the fourth NMOS transistor connected with a first reference level, a source electrode of the first PMOS transistor and a source electrode of the second PMOS transistor connected with a second reference level.

4. The gate drive circuit according to claim 1, wherein the second signal transmission circuit comprises a fifth NMOS transistor, a sixth NMOS transistor, a seventh NMOS transistor and a third PMOS transistor, a gate electrode of the fifth NMOS transistor and a gate of the third PMOS transistor connected with the previous level transmission signal, a drain electrode of the fifth NMOS transistor connected with a drain electrode of the third PMOS transistor and a gate of the sixth NMOS transistor, a source electrode of the fifth NMOS transistor and a source electrode of the sixth NMOS transistor connected with the first reference level, a drain electrode of the third PMOS transistor connected with the second reference level, a drain electrode of the sixth NMOS transistor connected with a source electrode of the seventh NMOS transistor, a gate of the seventh NMOS transistor connected with the first clock signal, a drain electrode of the seventh NMOS transistor connected with the nor gate latching circuit.

5. The gate drive circuit according to claim 1, wherein the nor gate latching circuit comprises a nor gate circuit, the nor gate circuit comprises an eighth NMOS transistor, a ninth NMOS transistor, a fourth PMOS transistor and a fifth PMOS transistor, a gate of the eighth NMOS transistor connected with a gate of the fourth PMOS transistor and the signal transmission circuit, the drain electrode of the eighth NMOS transistor connected with a source electrode of the ninth NMOS transistor, a drain electrode of the eighth NMOS transistor connected with a drain electrode of the fourth PMOS transistor and a drain electrode of the fifth PMOS transistor, a gate of the ninth NMOS transistor and a gate of the fifth PMOS transistor connected with the second clock signal, a source electrode of the fourth PMOS transistor and a source electrode of the fifth PMOS transistor connected with a first reference level.

6. The gate drive circuit according to claim 5, wherein the nor gate latching circuit further comprises a multi-stage inverter circuit connected with the nor gate latching circuit.

7. The gate drive circuit according to claim 6, wherein the multi-stage inverter circuit comprises a plurality of inverters arranged in series, the inverter comprises a tenth NMOS transistor and a sixth PMOS transistor, a source electrode of the tenth NMOS transistor connected with a second reference level, a source electrode of the sixth PMOS transistor connected with the first reference level, a gate electrode of the tenth NMOS transistor connected with a gate electrode of the sixth PMOS transistor as an input of the inverter and connected with the nor gate latching circuit or the previous level inverter, a drain electrode of the tenth NMOS transistor connected with a drain electrode of the sixth PMOS transistor as an output of the inverter.

8. The gate drive circuit according to claim 7, wherein the number of the inverters is three.

9. The gate drive circuit according to claim 1, wherein the first clock signal offsets half of a clock cycle to obtain the second clock signal.

10. A shift register circuit, wherein the shift register circuit comprises a signal transmission circuit and a nor gate latching circuit, the signal transmission circuit comprises a first signal transmission circuit and a second signal transmission circuit, the first signal transmission circuit transmits high part of a previous level transmission signal based on a first clock signal to the nor gate latching circuit, the second signal transmission circuit transmits low part of a previous level transmission signal based on the first clock signal to the nor gate latching circuit to perform latch, and a second clock signal triggers to output a current level gate drive pulse.

11. The shift register circuit according to claim 10, wherein the signal transmission circuit and the nor gate latching circuit are respectively triggered along rising edge.

12. The shift register circuit according to claim 10, wherein the first signal transmission circuit comprises a first NMOS transistor, a second NMOS transistor, a third NMOS transistor, a fourth NMOS transistor, a first PMOS transistor and a second PMOS transistor, a gate electrode of the first NMOS transistor connected with the previous level transmission signal, a gate electrode of the second NMOS transistor connected with the first clock signal, a source electrode of the second NMOS transistor connected with a drain electrode of the first NMOS transistor, a drain electrode of the second NMOS transistor connected with a source electrode of the first PMOS transistor, a gate electrode of the second PMOS transistor, a drain electrode of the third NMOS transistor, a gate electrode of the fourth NMOS transistor and the nor gate latching circuit, a gate electrode of the third NMOS transistor connected with a gate electrode of the first PMOS transistor, a drain electrode of the second PMOS transistor and a drain electrode of the fourth NMOS transistor, a source electrode of the first NMOS transistor, a source electrode of the third NMOS transistor and a source electrode of the fourth NMOS transistor connected with a first reference level, a source electrode of the first PMOS transistor and a source electrode of the second PMOS transistor connected with a second reference level.

13. The shift register circuit according to claim 10, wherein the second signal transmission circuit comprises a fifth NMOS transistor, a sixth NMOS transistor, a seventh NMOS transistor and a third PMOS transistor, a gate electrode of the fifth NMOS transistor and a gate of the third PMOS transistor connected with the previous level transmission signal, a drain electrode of the fifth NMOS transistor connected with a drain electrode of the third PMOS transistor and a gate of the sixth NMOS transistor, a source electrode of the fifth NMOS transistor and a source electrode of the sixth NMOS transistor connected with the first reference level, a drain electrode of the third PMOS transistor connected with the second reference level, a drain electrode of the sixth NMOS transistor connected with a source electrode of the seventh NMOS transistor, a gate of the seventh NMOS transistor connected with the first clock signal, a drain electrode of the seventh NMOS transistor connected with the nor gate latching circuit.

14. The shift register circuit according to claim 10, wherein the nor gate latching circuit comprises a nor gate circuit, the nor gate circuit comprises an eighth NMOS transistor, a ninth NMOS transistor, a fourth PMOS transistor and a fifth PMOS transistor, a gate of the eighth NMOS transistor connected with a gate of the fourth PMOS transistor and the signal transmission circuit, the drain electrode of the eighth NMOS transistor connected with a source electrode of the ninth NMOS transistor, a drain electrode of the eighth NMOS transistor connected with a drain electrode of the fourth PMOS transistor and a drain electrode of the fifth PMOS transistor, a gate of the ninth NMOS transistor and a gate of the fifth PMOS transistor connected with the second clock signal, a source electrode of the fourth PMOS transistor and a source electrode of the fifth PMOS transistor connected with a first reference level.

15. The shift register circuit according to claim 14, wherein the nor gate latching circuit further comprises a multi-stage inverter circuit connected with the nor gate latching circuit.

16. The shift register circuit according to claim 15, wherein the multi-stage inverter circuit comprises a plurality of inverters arranged in series, the inverter comprises a tenth NMOS transistor and a sixth PMOS transistor, a source electrode of the tenth NMOS transistor connected with a second reference level, a source electrode of the sixth PMOS transistor connected with the first reference level, a gate electrode of the tenth NMOS transistor connected with a gate electrode of the sixth PMOS transistor as an input of the inverter and connected with the nor gate latching circuit or the previous level inverter, a drain electrode of the tenth NMOS transistor connected with a drain electrode of the sixth PMOS transistor as an output of the inverter.

17. The shift register circuit according to claim 16, wherein the number of the inverters is three.

18. The shift register circuit according to claim 10, wherein the first clock signal offsets half of a clock cycle to obtain the second clock signal.

* * * * *